US011444206B2

(12) United States Patent
Yeh et al.

(10) Patent No.: US 11,444,206 B2
(45) Date of Patent: Sep. 13, 2022

(54) MANUFACTURING METHOD OF A SEMICONDUCTOR STRUCTURE

(71) Applicant: Au Optronics Corporation, Hsinchu (TW)

(72) Inventors: Po-Liang Yeh, New Taipei (TW); Chen-Chung Wu, Kaohsiung (TW); De-Zhang Deng, Hsinchu (TW); Chia-Ming Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/395,454

(22) Filed: Aug. 5, 2021

(65) Prior Publication Data

US 2021/0367079 A1 Nov. 25, 2021

Related U.S. Application Data

(62) Division of application No. 16/503,499, filed on Jul. 4, 2019, now Pat. No. 11,171,244.

(30) Foreign Application Priority Data

Mar. 22, 2019 (TW) .................. 108109930

(51) Int. Cl.
*H01L 21/02* (2006.01)
*H01L 29/786* (2006.01)
*H01L 29/66* (2006.01)

(52) U.S. Cl.
CPC .... *H01L 29/7869* (2013.01); *H01L 21/02554* (2013.01); *H01L 29/66969* (2013.01)

(58) Field of Classification Search
CPC .......... H01L 27/3262; H01L 29/66969; H01L 27/124; H01L 29/7869; H01L 21/02554; H01L 27/1225; H01L 27/1288; H01L 21/0274; H01L 21/0332; H01L 29/78609; H01L 29/78693
See application file for complete search history.

(56) References Cited

U.S. PATENT DOCUMENTS

2014/0159034 A1* 6/2014 Yang ................. H01L 29/66969
438/34

* cited by examiner

*Primary Examiner* — Samuel Park
(74) *Attorney, Agent, or Firm* — JCIPRNET

(57) ABSTRACT

A manufacturing method of a semiconductor structure including the following steps is provided: forming a first metal layer on a substrate; forming an insulating layer on the first metal layer; forming an oxide semiconductor material layer on the insulating layer; performing an annealing treatment to the oxide semiconductor material layer; forming an etch stopping material layer on the oxide semiconductor material layer; forming a photoresist material layer on the etch stopping material layer and defining thereof with a half tone photomask to form a photoresist pattern; using the photoresist pattern as a mask, patterning the etch stopping material layer to form an etch stopping pattern, and patterning the oxide semiconductor material layer to form an oxide semiconductor layer; removing the photoresist pattern; using the etch stopping pattern as the mask, patterning the insulating layer; forming a second metal layer on the etch stopping pattern; and patterning the oxide semiconductor layer.

8 Claims, 9 Drawing Sheets

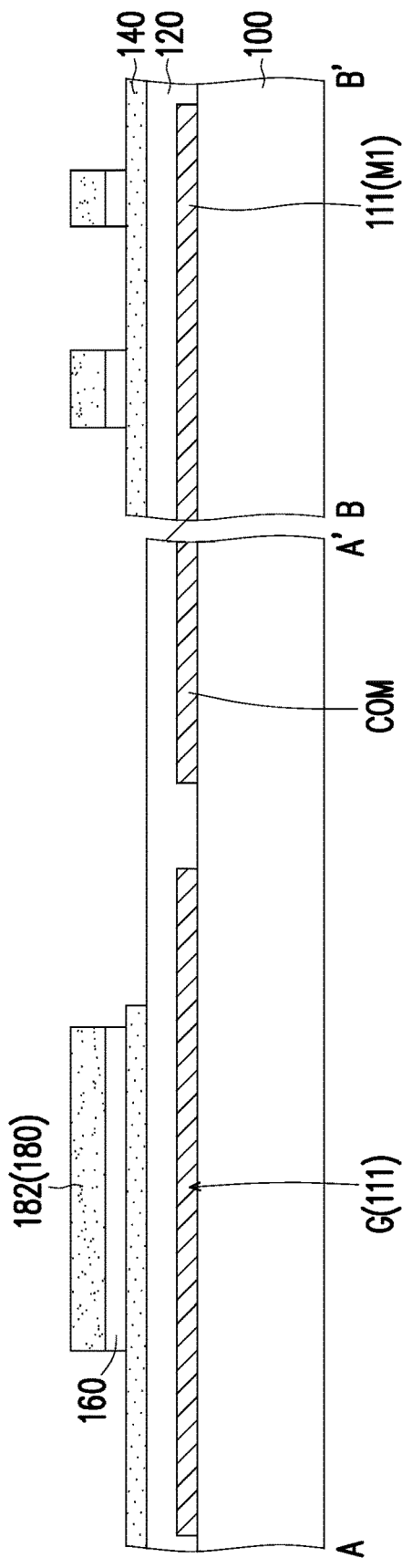
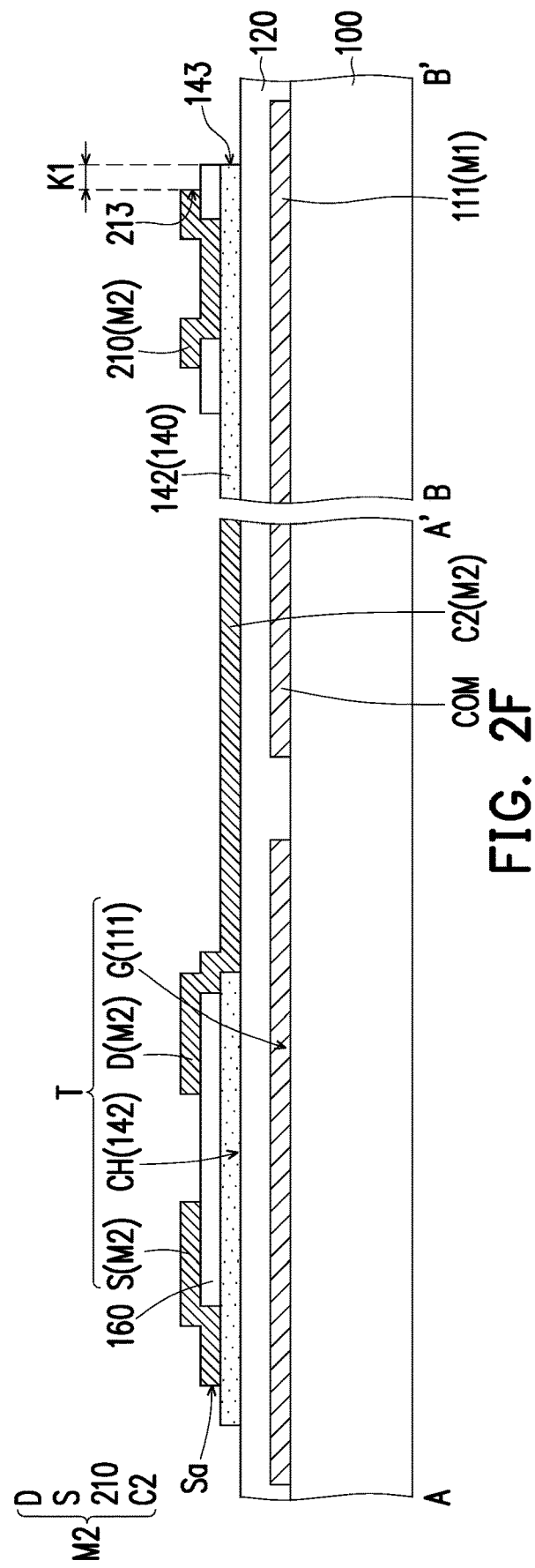

MANUFACTURING METHOD OF A SEMICONDUCTOR STRUCTURE

CROSS-REFERENCE TO RELATED APPLICATION

This application is a divisional application of and claims the priority benefit of U.S. patent application Ser. No. 16/503,499, filed on Jul. 4, 2019, now allowed. The U.S. patent application Ser. No. 16/503,499 claims the priority benefit of Taiwan application serial no. 108109930, filed on Mar. 22, 2019. The entirety of each of the above-mentioned patent applications is hereby incorporated by reference herein and made a part of this specification.

BACKGROUND

Technical Field

The disclosure relates to a manufacturing method of a semiconductor structure, and in particular to a manufacturing method of a semiconductor structure including an etch stopping pattern.

Description of Related Art

With the progress of modern information technology, displays of different specifications have been broadly applied in screens of consumer electronic products. Regarding trends of the market nowadays, a manufacturing process of a high definition Liquid Crystal Displays (LCD) and an Organic Electro-luminescent Display (OELD or OLED) include arranging a semiconductor element array on a substrate, and the semiconductor element includes a thin film transistor (TFT) and a pixel structure.

Generally, the TFT of a high definition display elects to use a metal oxide semiconductor layer. The metal oxide semiconductor layer (such as indium gallium zinc oxide (IGZO)) may generate a carrier (an electron) due to oxygen vacancies. Therefore, the metal oxide semiconductor layer itself is in a conducting state, and a threshold voltage (Vt) is generally a negative value, and thus leading an issue of current leakage. As a result, known manufacturing methods cannot perform tests of open circuit and short circuit nor a conducting wire repairing procedure instantly after manufacturing a source electrode, a drain electrode and other signal lines connected to the metal oxide semiconductor layer in the same layer. Therefore, how to develop a semiconductor structure that has a good electrical property and can perform tests and repair procedures easily is indeed a goal desired to be achieved by any developer.

SUMMARY

The invention provides a manufacturing method of a semiconductor structure, which is adapted to perform a test and repair procedure, has a good electrical property and may reduce the number of photomasks used and costs.

A manufacturing method of a semiconductor structure of the invention includes the following steps. A substrate is provided. A first metal layer is formed on the substrate and the first metal layer is patterned to define a gate line and a masking metal pattern. A gate insulating layer is formed on the substrate and covers the gate line and the masking metal pattern. An oxide semiconductor material layer is formed on the gate insulating layer. An annealing treatment is performed to the oxide semiconductor material layer. An etch stopping material layer is formed on the oxide semiconductor material layer. A photoresist material layer is formed on the etch stopping material layer. The photoresist material layer is defined by a half tone photomask to form a photoresist pattern. The photoresist pattern is used as a mask, and the etch stopping material layer is patterned to form an etch stopping pattern. The photoresist pattern is used as the mask, and the oxide semiconductor material layer is patterned to form an oxide semiconductor layer and to define a first opening. The first opening overlaps the gate insulating layer. An ashing process procedure is performed to remove the photoresist pattern. The etch stopping pattern is used as a mask, and the gate insulating layer is patterned to form a first contact window. The first contact window overlaps the masking metal pattern, wherein an orthographic projection of the first contacting window on the substrate is located within an orthographic projection of the first opening on the substrate. A second metal layer is formed on the etch stopping pattern and the second metal layer is patterned to define a source electrode, a drain electrode, a signal line and a data line. Parts of the etch stopping pattern are located between the second metal layer and the oxide semiconductor material layer. The data line is electrically connected to the masking metal pattern through the first contacting window. Also, the oxide semiconductor layer is pattered to define an oxide semiconductor pattern. The source electrode, the drain electrode and the signal line are electrically connected to the oxide semiconductor pattern.

Based on the above, the semiconductor structure and the manufacturing method thereof of an embodiment of the invention may directly dispose an etch stopping pattern with oxygen atoms on an oxide semiconductor layer and/or on an oxide semiconductor pattern. In doing so, the etch stopping pattern may be used to provide oxygen atoms to the oxide semiconductor layer and/or oxide semiconductor pattern, so as to improve the issue of oxygen vacancies. Thus, apart from improving an electrical property of the oxide semiconductor pattern, the oxide semiconductor pattern may also be made to have a property of a semiconductor. As such, an open circuit test and a short circuit test may be directly performed on the semiconductor structure of the present embodiment instantly after completing the step of forming a source electrode, a drain electrode, and a signal line. Therefore, an additional opening procedure is not needed, so that a test and repair procedure is adapted to be performed easily. In addition, a risk of disconnection may be reduced so that an excellent electrical property is obtained, and therefore manufacturing time and costs are further reduced. Moreover, the etch stopping pattern and the oxide semiconductor layer may be formed through a single photoresist mask, and a patterning is performed to a gate insulating layer through using the etch stopping pattern as a mask. Therefore, the semiconductor structure and the manufacturing method thereof of the invention may reduce the number of the photomasks used, and further reduce manufacturing costs.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2H are schematic cross-sectional views along cross-sectional lines A-A' and B-B' in FIG. 1 showing a manufacturing process of the semiconductor structure.

DESCRIPTION OF THE EMBODIMENTS

Figure 1:
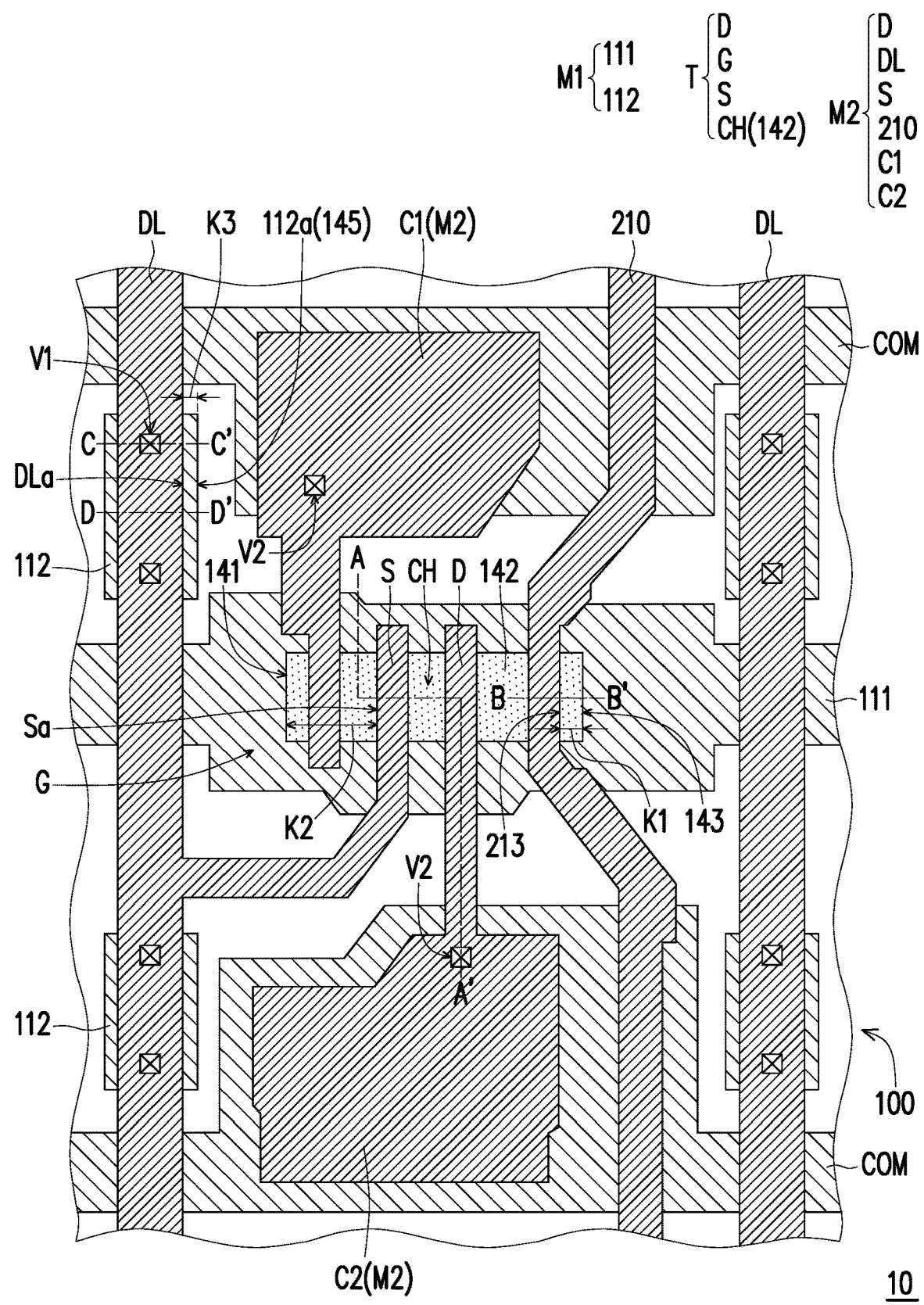
FIG. 1 is a partial schematic top view of a semiconductor structure according to an embodiment of the invention.

In order to make the aforementioned and other features and advantages of the invention more comprehensible, several embodiments accompanied with figures are described in detail below. As persons with ordinary skills in the art can be aware of, the embodiments as described can be modified in various methods, without departing from the spirit or scoped of the invention.

In the accompanying drawings, for clarity, the thickness of each element is exaggerated. Throughout the specification, the same reference numerals in the accompanying drawings denote the same elements. It should be understood that when an element such as a layer, film, region or substrate is referred to as being "on", "connected to" or "overlapping with" another element, it may be directly on or connected to the other element, or intervening elements may also be present. In contrast, when an element is referred to as being "directly on" or "directly connected to" another element, there are no intervening elements present. As used herein, the term "connected" may refer to physically connected and/or electrically connected.

It should be understood that, although the terms "first", "second", "third", etc., may be used herein to describe various elements, components, regions, layers and/or sections, these elements, components, regions, layers, and/or sections should not be limited by these terms. These terms are used to distinguish one element, component, region, layer or section from another element, component, region, layer or section. Thus, a "first element", "component", "region", "layer" or "part" discussed below may be referred to as a second element, component, region, layer or part, without departing from the teaching of the specification.

The terminology used herein is only for the purpose of describing specific embodiments and is not intended to be restrictive. As used herein, the singular forms "a", "an", and "the" are intended to cover the plural forms including "at least one" as well, unless the context clearly indicates otherwise. "or" represents "and/or". The term "and/or" used herein includes any one or all combinations of one or more of the relevant listed items. It will be further understood that the terms "comprise" and/or "include", when used herein, specifies the presence of the specified features, regions, entirety, steps, operations, elements, and/or components, but do not exclude the presence or addition of one or more other features, regions, entireties, steps, operations, elements, components, and/or combinations thereof.

Moreover, relative terms such as "below" or "bottom" and "above" or "top" may serve to describe the relation between one component and another component herein as shown in the drawings. It should also be understood that the relative terms are intended to include different orientations of a device in addition to the orientation shown in the drawings. For example, if a device in the drawings is turned upside down, a component described as being "below" another component shall be re-orientated to be "above" the another component. Thus, the exemplary term "below" may include the orientations of "below" and "above", depending on the specific orientation of the drawings. Similarly, if a device in the drawings is turned upside down, a component described to be "under" or "below" another component shall be re-oriented to be "above" the another component. Therefore, the exemplary term "under" or "below" may include orientations of "above" and "below".

The term "about", "substantially", "basically", or "similar" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value.

Unless otherwise defined, all terms (including technical and scientific terms) used herein have the same meaning as commonly understood by people of ordinary skill in the art. It will be further understood that terms, such as those defined in the commonly used dictionaries, should be interpreted as having a meaning that is consistent with their meaning in the context of the relevant art and the invention and will not be interpreted in an idealized or overly formal sense unless expressly so defined herein.

Exemplary embodiments will be described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shapes of the regions, and are not intended to limit the scope of the claims.

FIG. 1 is a partial schematic top view of a semiconductor structure according to an embodiment of the invention. FIG. 1 only schematically shows portions of the components for ease of explanation and observation. FIG. 2A to FIG. 2H are schematic cross-sectional views along cross-sectional lines A-A' and B-B' in FIG. 1 showing a manufacturing process of the semiconductor structure. FIG. 3A to FIG. 3D are schematic cross-sectional views along a cross-sectional line C-C' in FIG. 1 showing a manufacturing process of the semiconductor structure. Please refer to FIG. 1 and FIG. 2H first. A semiconductor structure 10 of the present embodiment is disposed on a substrate 100. The semiconductor structure 10 includes a first metal layer M1, a gate insulting layer 120, an oxide semiconductor layer 140, an oxide semiconductor pattern 142, an etch stopping pattern 160, a second metal layer M2, a first passivation layer 191, a color resist layer CF, a second passivation layer 192 and a pixel electrode PE. In the present embodiment, the first metal layer M1 may define a gate line 111 and a masking metal layer 112. The second metal layer M2 may define a source electrode S, a drain electrode D, a signal line 210 and a data line DL. In some embodiments, the first metal layer M1 may define a plurality of common electrode lines COM. The common electrode lines COM are disposed parallel to the gate line 111 and interlaces with the signal line 210 and the data line DL. As shown in FIG. 1, the common electrode lines COM may partly overlap with storage capacitors C1 and C2. In the present embodiment, the storage capacitor C1 may be electrically connected to the oxide semiconductor pattern 142. The storage capacitor C2 may be electrically connected to the drain electrode D. Therefore, the storage capacitors C1 and C2 may increase the efficiency and performance of the charging and the discharging of the semiconductor structure 10. An embodiment as follows is used to briefly described a manufacturing method of the semiconductor structure 10.

Figure 2A:
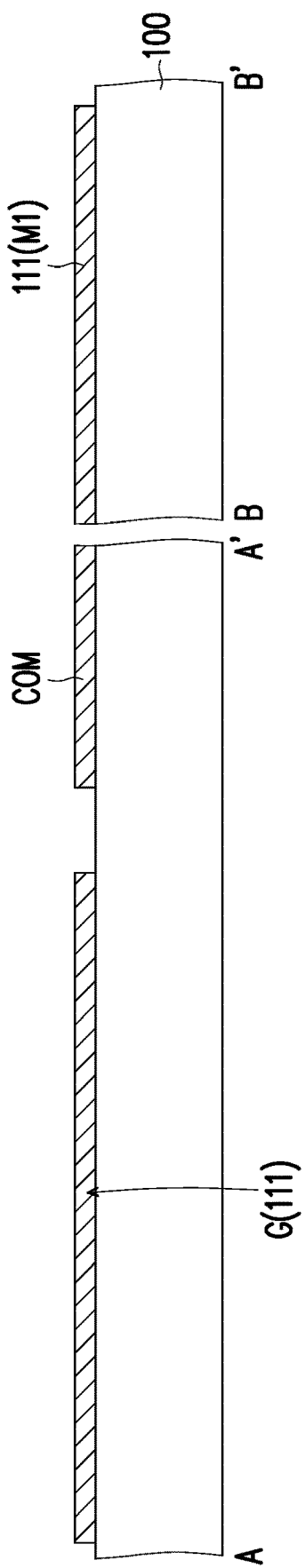

Referring to FIG. 1 and FIG. 2A. The manufacturing method of the semiconductor structure 10 including the following steps. Firstly, a substrate 100 is provided. The substrate 100 may be a rigid substrate or a flexible substrate. For example, a material of a rigid substrate may be a thick glass or other suitable materials. A material of a flexible substrate may be a thin glass, polyimide (PI), polyethylene naphthalate (PEN), polyethylene terephthalate (PET), polyethersulfone (PES), thin metal or other suitable materials, but the invention is not limited thereto.

Referring to FIG. 2A. Next, the first metal M1 is formed on the substrate 100. The first metal layer M1 may be patterned to define the gate line 111 and the masking metal pattern 112. In some embodiments, the first metal layer M1 may further define the common electrode lines COM, but the invention is not limited thereto. In other embodiments, the common electrode lines COM and the first metal layer M1 may also be separately formed on the substrate 100 during the same process or in sequence, and does not belong to the same layer. In the present embodiment, the gate line 111 may be, for example, a scan line, and the gate line 111 may be electrically connected to the gate G. As shown in FIG. 1, the gate G may be directly manufactured in the gate line 111, but the invention is not limited thereto. In the present embodiment, the first metal layer M1 and the common electrode lines COM may be, for example, metal materials, but the invention is not limited thereto. In other embodiments, the first metal layer M1 and the common electrode lines COM may also use other conductive materials (such as alloy, nitride of metal materials, oxide of metal materials, oxynitride of metal materials, or a stacked layer of metal materials and other conductive materials). In the present embodiment, a method of forming the first metal layer M1 and the common electrode lines COM includes physical vapor deposition (PVD), chemical vapor deposition (CVD), or atomic layer deposition (ALD) or other suitable methods, but the invention is not limited thereto.

Figure 2B:
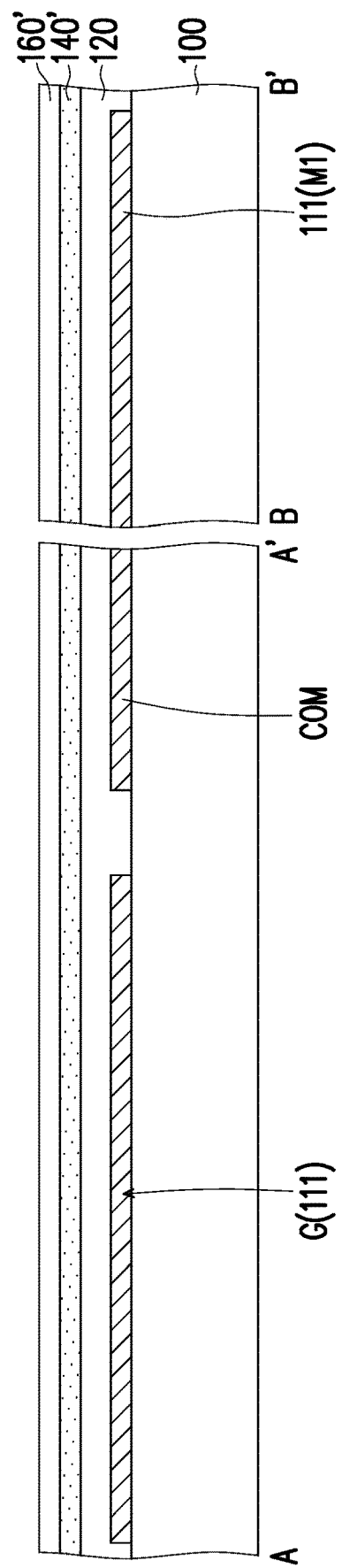

Referring to FIG. 2B. Then, the gate insulating layer 120 is formed on the substrate 100 to cover the gate line 111, the gate G, the common electrode lines COM and parts of the substrate 100. A material of the gate insulating layer 120 may be an inorganic material (such as silica, silicon nitride, silicon oxynitride, or a stacked layer of at least two of the above materials), an organic material, or a combination thereof.

Further, an oxide semiconductor material layer 140' is formed on the gate insulating layer 120. In the present embodiment, a material of the oxide semiconductor material layer 140' includes, for example, indium gallium zinc oxide (IGZO), indium zinc oxide (IZO), indium gallium oxide (IGO), indium tin zinc oxide (ITZO), zinc oxide (ZnO) or other suitable materials. The oxide semiconductor material layer 140' may be a single layer of any one of the above materials, or a stacked layer of a plurality of the above materials, but the invention is not limited thereto. In some embodiments, a material of the oxide semiconductor material layer 140' may further include a metal silicide, such as indium silicide (IS), but the invention is not limited thereto. In the present embodiment, a method of forming the oxide semiconductor material layer 140' includes PVD, CVD, ALD or other suitable methods, but the invention is not limited thereto.

Further, an annealing treatment is performed to the oxide semiconductor material layer 140', to make the oxide semiconductor material layer 140' crystalized and to obtain an electrical property. At the moment, the oxide semiconductor material layer 140' may generate a carrier (electron) due to, for example, oxygen vacancy; therefore, the oxide semiconductor material layer 140' is in a conducting state.

Next, an etch stopping material layer 160' is formed on the oxide semiconductor material layer 140'. In the present embodiment, a material of the etch stopping material layer 160' is, for example, an oxide including hafnium oxide, silica, aluminum oxide, or other suitable materials, but the invention is not limited thereto. In the present embodiment, a method of forming the etch stopping material layer 160' includes, for example, PVD, CVD, ALD or other suitable methods, but the invention is not limited thereto.

It is worth mentioning that, since the etch stopping material layer 160' with oxygen atoms may be directly disposed on the oxide semiconductor material layer 140', the etch stopping material layer 160' may be used to provide the oxygen atoms to the oxide semiconductor material layer 140' to improve the issue of oxygen vacancy. Thus, a threshold voltage of the oxide semiconductor material layer 140' may be a positive value, so as to improve an issue of current leakage, and improving the electrical property of the oxide semiconductor material layer 140'. Under the above configuration, the oxide semiconductor material layer 140' may still remain in a non-conducting state, and thus having the property of a semiconductor.

Figure 2C:
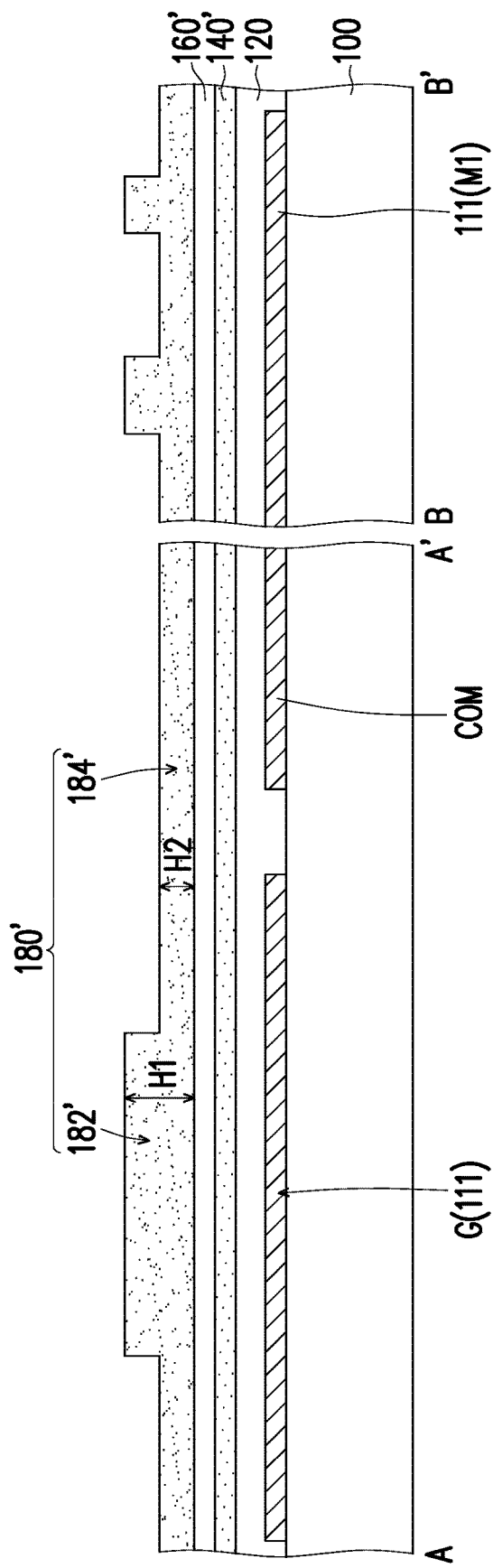

Referring to FIG. 2C. Then, a photoresist material layer 180' is formed on the etch stopping material layer 160'. The photoresist material layer 180' may be, for example, a positive-type photoresist material or a negative-type photoresist material. The present embodiment is, for example, using the positive-type photoresist material as the material for the photoresist material layer 180'. In other words, exposed parts of the photoresist material layer 180' may be dissolved in a developer. However, the invention is not limited thereto.

Figure 2D:
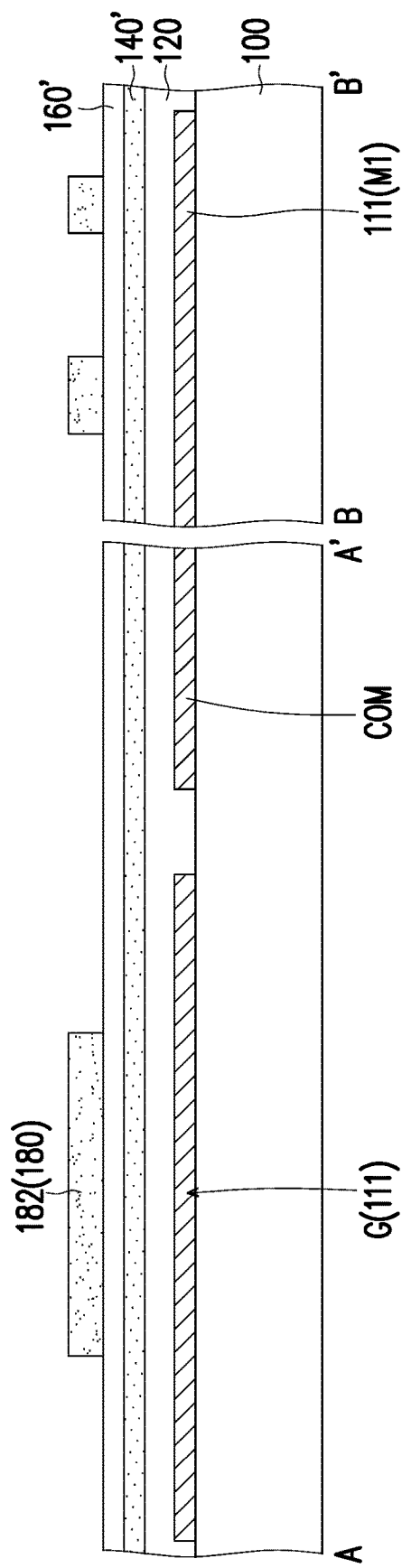

Referring to FIG. 2C and FIG. 2D. Next, a half tone photomask (HTM), a phase shift photomask, or a gray tone photomask may be used as the mask to define the photoresist material layer 180' through performing procedures of exposing and developing the photo resist material layer 180'. Specifically, as shown in FIG. 2C, an exposure procedure may be conducted to facilitate different levels of the exposure to different parts of the photoresist material layer 180' through the use the HTM (not shown), and parts of different thicknesses are then defined by dissolving the above different parts in the developer during the development procedure. For example, the photoresist material layer 180' may include a convex portion 182' and a concave portion 184' and the convex portion 182' and the concave portion 184' are continuously disposed on the etch stopping material layer 160'. A thickness of the convex portion 182' is greater than the thickness of the concave portion 184'. In other words, a first thickness H1 of the convex portion 182' is greater than a second thickness H2 of the concave portion 184'. As shown in FIG. 2C, the first thickness H1 is, for example, twice the second thickness H2, but the invention is not limited thereto. In some embodiments, according to requirements of users, the first thickness H1 may be, for example, three, four, or more times the second thickness H2. In some embodiments, the first thickness H1 is, for example, 2.4 µm, but the invention is not limited thereto.

As shown in FIG. 2C and FIG. 2D, the photoresist material layer 180' is continuously defined by the HTM and the development procedure is performed, so as to remove the part of concave portion 184' in the photoresist material layer 180'. The part of a developed convex portion 182 is left to form a photoresist pattern 180. In the present embodiment, the thickness of the convex portion 182' is greater than the thickness of the developed convex portion 182. From another perspective, the thickness of the developed convex portion 182 is, for example, half of the first thickness H1 of the convex portion 182'; but the invention is not limited thereto.

Referring to FIG. 2D and FIG. 2E. In the present embodiment, in a direction perpendicular to the substrate 100, the patterned photoresist pattern 180 only overlaps parts of the etch stopping material layer 160' to expose a surface of the etch stopping material layer 160'. Next, the photoresist pattern 180 is used as a mask to pattern the etch stopping material 160' to form an etch stopping pattern 160. A method of patterning the etch stopping material 160' includes using an acidic or alkaline solvent to remove parts of the etch stopping material 160' which do not overlap with the photoresist pattern 180, but the invention is not limited thereto. As shown in FIG. 2E, the etch stopping pattern 160 overlaps with the photoresist pattern 180, so as to transfer the pattern of the photoresist pattern 180 onto the etch stopping pattern 160.

As shown in FIG. 2D and FIG. 2E, after the steps of forming the etch stopping pattern 160, the photoresist pattern 180 and the etch stopping pattern 160 may be used as a mask to pattern the oxide semiconductor material layer 140' to form an oxide semiconductor layer 140. As shown in FIG. 2E, parts of the oxide semiconductor layer 140 overlap with the gate line 111, but do not overlap with the common electrode lines COM, but the invention is not limited thereto. In some embodiments, the oxide semiconductor layer 140 may overlap with the common electrode lines COM. From another perspective, in the above step of patterning of the oxide semiconductor material layer 140', parts of the oxide semiconductor material layer 140' may be removed to expose parts of the gate insulating layer 120. In the above step, a first opening O1 (shown in FIG. 3C) may be simultaneously defined, in order to electrically connect the first metal layer M1 to the second metal layer M2 in a subsequent manufacturing process. The above step defining the first opening O1 will be described in the later paragraphs of the specification. In addition, it should be noticed that FIG. 2E is a partial schematic cross-sectional view along cross-sectional lines A-A' and B-B of the semiconductor structure 10 of FIG. 1; therefore, patterning the oxide semiconductor material layer 140', in order to form the oxide semiconductor layer 140 having the first opening O1, is not shown.

Referring to FIG. 1, FIG. 2E and FIG. 2F. Next, an ashing procedure is performed to remove the photoresist pattern 180. Then, the second metal layer M2 is formed on the etch stopping pattern 160. The second metal layer M2 may partially cover the gate insulating layer 120, the oxide semiconductor layer 140 and the etch stopping pattern 160. From another perspective, parts of the etch stopping pattern 160 may be located between the second metal layer M2 and the oxide semiconductor layer 140.

Next, the second metal layer M2 may be patterned to define the source electrode S, the drain electrode D, the signal line 210 and the data line DL. In some embodiments, the second metal layer M2 may further define storage capacitors C1 (shown in FIG. 1), and C2, but the disclosure is not limited thereto. In some embodiments, the storage capacitors C1 and C2, and the second metal layer M2 may be disposed separately. As shown in FIG. 1 and FIG. 2F, the storage capacitor C2 is electrically connected to the drain electrode D and belong to the same layer. The storage capacitor C2 may also partially overlap with the common electrode lines COM. Therefore, a capacitance may be generated in the gate insulating layer 120 between the storage capacitor C2 and the common gate lines COM.

Then, the oxide semiconductor layer 140 is patterned to define the oxide semiconductor pattern 142. In other words, as shown in FIG. 1 and FIG. 2F, the oxide semiconductor pattern 142 and the oxide semiconductor layer 140 are of the same layer and the oxide semiconductor pattern 142 may be defined as parts of the oxide semiconductor layer 140 overlapping the source electrode S, the drain electrode D and the signal line 210. From another perspective, an orthographic projection of the oxide semiconductor pattern 142 on the substrate 100 overlaps parts of an orthographic projection of the gate G on the substrate 100. Based on conductivity considerations, in the present embodiment, the second metal layer M2 (including such as the source electrode S, the drain electrode D, the signal line 210 and a data line DL) is usually manufactured by using a metal material; however, the invention is not limited thereto. In other embodiments, the second metal layer M2 may also use other conductive materials (such as alloy, metal nitride, metal oxide, metal oxynitride or other suitable materials) or a metal material and a stacked layer of other conductive materials to manufacture. Thus, a thin film transistor (TFT) of the semiconductor structure 10 of the present embodiment is completed.

Referring to FIG. 1 and FIG. 2F. In the present embodiment, the TFT is disposed on the substrate 100, including the gate G, the oxide semiconductor pattern 142, the source electrode S and the drain electrode D. The source electrode S and the drain electrode D are respectively disposed on the etch stopping pattern 160. The gate G and the oxide semiconductor pattern 142 are separated by the gate insulating layer 120. The oxide semiconductor pattern 142 between the source electrode S and the drain electrode D is a channel region CH, and the channel region CH overlaps the gate G on the gate line 111. In the present embodiment, parts of the etch stopping pattern 160 may overlap the channel region CH and the gate G. The etch stopping layer 160 may expose parts of the oxide semiconductor pattern 142 to allow the source electrode S and the drain electrode D electrically connected to the oxide semiconductor pattern 142. In the present embodiment, the TFT T is, for example, a bottom-gate TFT, but the invention is not limited thereto. In other embodiment, the TFT T may be a top-gate TFT or other suitable types of TFT. It should be noted that FIG. 1 and FIG. 2F only show a TFT T; however, the number is not limited by the number shown in FIG. 1 and FIG. 2. Persons skilled in the art should understand that, in fact, a plurality of TFTs T may be disposed on the substrate 100 in an array; therefore, the substrate 100 may have thousands of, tens of thousands of, or millions of TFTs T.

In the present embodiment, as shown in FIG. 1, the data line DL is defined by the metal layer M2. The data line DL and the gate line 111 are disposed and interlaced with each other. The data line DL and the gate line 111 belong to layers on different levels. In the present embodiment, the TFT T is electrically connected to the gate line 111 and the data line DL. Specifically, the gate G and the gate line 111 are electrically connected, and the source electrode S and the data line DL are electrically connected.

As shown in FIG. 1 and FIG. 2, the second metal layer M2 may further define a signal line 210, and an extending direction of the signal line 210 is substantially parallel to an extending direction of the data line DL. In the present embodiment, the signal line 210 partially overlaps with the etch stopping pattern 160, and the signal line 210 contacts the oxide semiconductor pattern 142 through an opening (not labeled) on the etch stopping pattern 160. In this way, the signal line 210 may be electrically connected to the TFT T through the oxide semiconductor pattern 142. In the present embodiment, the TFT T of the semiconductor structure 10 may achieve an effect of voltage dividing through the signal line 210; therefore, a performance of the semiconductor structure 10 may be increased.

In the present embodiment, a distance K1 exists between an edge of the signal line 210 and an edge of the oxide semiconductor pattern 142. Specifically, as shown in FIG. 1 and FIG. 2F, the oxide semiconductor pattern 142 has a short side 143 and another short side 141 opposite to the short side 143. An orthographic projection of the short side 143 of the oxide semiconductor pattern 142 on the substrate 100 is parallel to an orthographic projection of a long side 213 of the signal line 210 overlapping the oxide semiconductor pattern 142 on the substrate 100. The long side 213 is adjacent to an edge of the short side 143 of the oxide semiconductor pattern 142. The distance K1 between the short side 143 and the long side 213 ranges from 0.5 μm (micrometer) to 1 μm. In other words, the orthographic projection of the oxide semiconductor pattern 142 on the substrate 100 extrudes from the orthographic projection of the signal line 210 to the substrate 100, but the invention is not limited thereto.

In the present embodiment, a distance K2 exists between an edge of the source electrode S and the edge of the oxide semiconductor pattern 142. Specifically, as shown in FIG. 1, an orthographic projection of the another short side 141 of the oxide semiconductor pattern 142 on the substrate 100 is parallel to an orthographic projection of a long side Sa of the source electrode S on the substrate 100. The long side Sa is an edge next to the another short side 141 of the oxide semiconductor pattern 142. The distance K2 between the another short side 141 and the long side Sa ranges from 0.5 μm to 1 μm. In other words, the orthographic projection of the oxide semiconductor pattern 142 on the substrate 100 protrudes from the orthographic of the source electrode S on the substrate 100; but the invention is not limited thereto.

It is worth noting that the etch stopping pattern 160 may be directly disposed on the oxide semiconductor layer 140 and/or on the oxide semiconductor pattern 142, and through the etch stopping pattern 160, the oxygen atoms are provided to the oxide semiconductor layer 140 and/or the oxide semiconductor pattern 142 to improve the issue of oxygen vacancy. Therefore, compared to known manufacturing processes of forming a protective layer on the oxide semiconductor pattern 142 after forming the source electrode S and the drain electrode D first, and then is able to perform an open circuit test and a short circuit test, the oxide semiconductor pattern 142 of the present embodiment has possessed semiconductor properties after the steps of forming the etch stopping pattern 160. Therefore, the present embodiment may perform an electrical property test procedure (not shown) instantly after finishing the step of patterning the second metal layer M2 (such as the step of forming the electrode S, the drain electrode D, the signal line 210 and the data line DL) and the step of defining the oxide semiconductor pattern 142. Therefore, the open circuit test and the short circuit test are directly performed to the source electrode S, the drain electrode D and the signal line 210. Under the above configuration, another opening procedure to expose the source electrode S, the drain electrode D and the signal line 210 that are to be tested is not needed, so that a test and repair procedure is adapted to be performed easily. In addition, a procedure of opening a hole to expose the source electrode S, the drain electrode D and the signal line 210 may be avoided to reduce a risk of disconnection so that an excellent electrical property is obtained. In this way, the manufacturing time and costs may be further reduced.

Figure 2G:
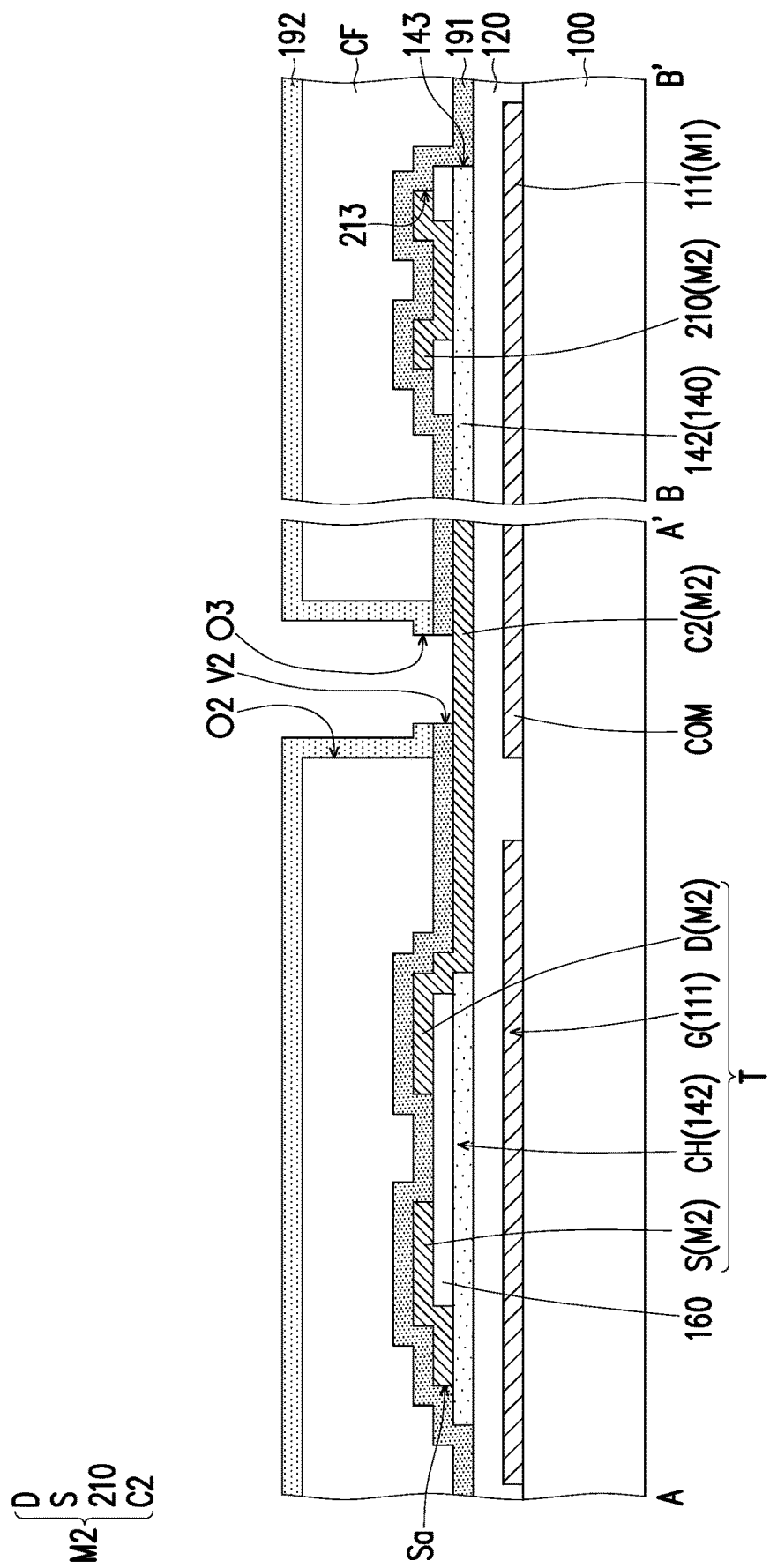

Referring to FIG. 2G. Next, a first passivation layer 191 is formed on the etch stopping pattern 160. The first passivation layer 191 covers parts of the gate insulating layer 120, the etch stopping pattern 160 and the second metal layer M2 (such as the source electrode S, drain electrode D, the signal line 210 and the storage capacitor C2). The first passivation layer 191 has a second contacting window V2. As shown in FIG. 1 and FIG. 2G, in a direction perpendicular to the substrate 100, the second contacting window V2 overlaps with parts of the storage capacitors C1 and C2. From another perspective, the second contacting window V2 may expose surfaces of the storage capacitors C1 and C2 (only the storage capacitor C2 is shown in FIG. 2G). In the present embodiment, a material of the first passivation layer 191 includes an inorganic material such as silica, silicon nitride, silicon oxynitride, or a stacked layer of at least two of the above materials, but the invention is not limited thereto.

Then, a color resist layer CF is formed on the first passivation layer 191. The color resist layer CF is, for example, a photoresist layer having a color filter function. In the present embodiment, the color resist layer CF is disposed on the substrate 100 having the TFT T array. In other words, the substrate 100 is, for example, a color filter on array (COA) technology which integrates a color filter layer to an array substrate. However, the invention is not limited thereto. In some embodiments, the color resist layer CF may also be disposed on a color filter substrate opposite to the substrate 100.

In the present embodiment, the color resist layer CF has a second opening O2 in a direction perpendicular to the substrate 100. The second opening O2 overlaps with the second contacting window V2 and the storage capacitor C2. In other words, the second opening O2 and the second contacting window V2 jointly expose the storage capacitor C2. Besides, as shown in FIG. 2G, an orthographic projection of the second contacting window V2 on the substrate 100 is located within an orthographic projection of the second opening O2 on the substrate 100.

Nest, the second passivation layer 192 is formed on the color resist layer CF. The second passivation layer 192 has a third opening O3 in a direction perpendicular to the substrate 100. The third opening O3 overlaps with the second contacting window V2. In the present embodiment, the third opening O3 may completely overlap the second contacting window V2, but the invention is not limited thereto. In the present embodiment, a material of the second passivation layer 192 includes, for example, an organic material such as polyesters (PET), polyolefins, polyacrylamide, polycarbonates, polyethylene oxide, polystyrene, polyethers, polyketides, polyalcohols, polyaldehydes, other suitable materials or a combination thereof; but the invention is not limited thereto. In other embodiments, the material of the second passivation layer 192 may also include a photoresist material.

The above description described an example in which the second contacting window V2, the second opening O2 and the third opening O3 are formed respectively when the first passivation layer 191, the color resist layer CF, and the second passivation layer 192 are respectively formed, but the invention is not limited thereto. In some embodiments, the second opening O2 may be formed through patterning the color resist layer CF after the color resist layer CF is formed. Next, the second passivation layer 192 is formed, and its parts conformally filled into the second opening O2. Afterward, a photolithography procedure is performed again to pattern the first passivation layer 191 and the second passivation layer 192 simultaneously. Thus, the third opening O3 and the second contacting window V2 overlapping the third opening O3 are formed simultaneously and the drain electrode D is exposed. Thereby, orthographic projections of the third opening O3 and the second contacting window V2 on the substrate 100 are both located within an orthographic projection of the second opening O2 on the substrate 100; but the invention is not limited thereto.

Figure 2H:
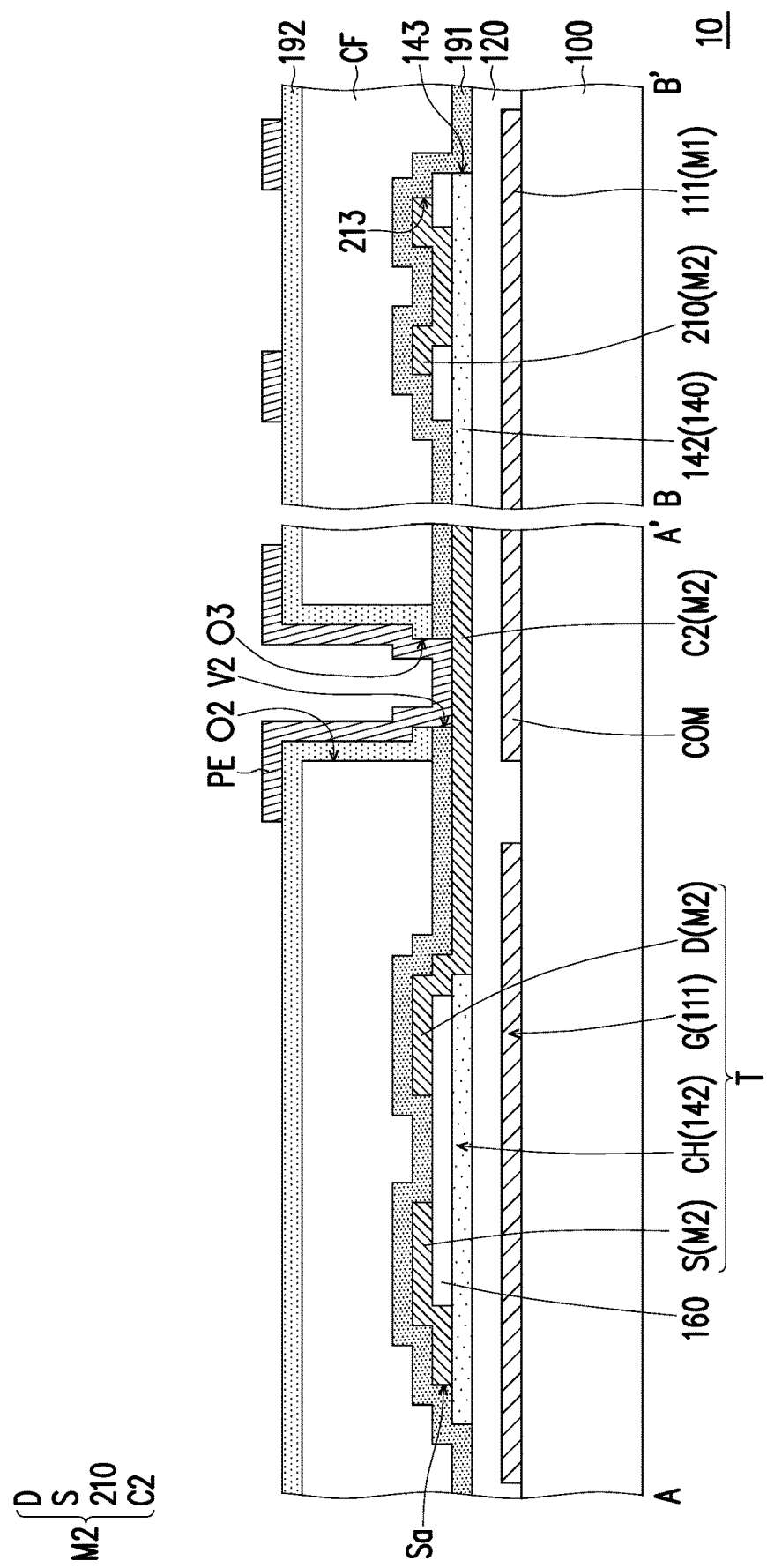

Referring to FIG. 2H. Then, a pixel electrode PE is formed on the second passivation layer 192. In the present embodiment, the pixel electrode PE and the TFT T are electrically connected. Specifically, the pixel electrode PE may be electrically connected with the storage capacitor C2 through the second opening O2, the third opening O3 and the second contacting window V2. Then, the pixel electrode PE may contact the drain electrode D through the storage capacitor C2, and thus electrically connected to the TFT T. The pixel electrode PE is a transparent conductive material which includes a metal oxide such as indium tin oxide, indium zinc oxide, aluminum tin oxide, aluminum zinc oxide, indium germanium zinc oxide, or other suitable oxides, or a stacked layer of at least two of the above oxides, but the invention is not limited thereto. Thus, the manufacturing of the TFT T of the semiconductor structure 10 is substantially completed.

It is worth noting that the present embodiment may simultaneously pattern the gate insulating layer 120 and define the first contacting window V1 through the photomask used to form the etch stopping pattern 160. An embodiment as follows would briefly describe a method of electrically connecting the first metal layer M1 to the second metal layer M2.

Figure 3A:
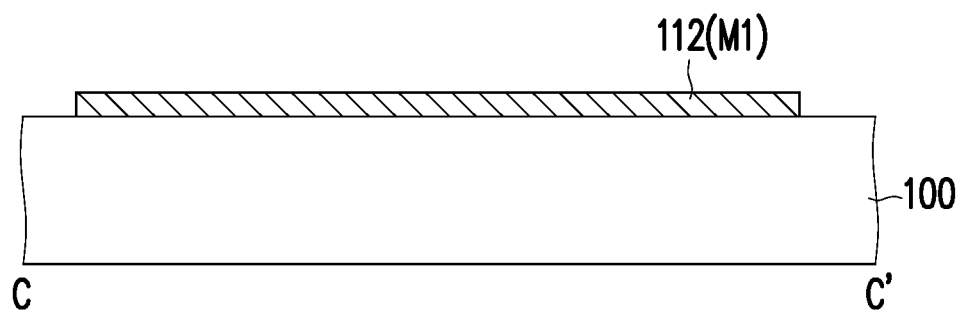
FIG. 3A to FIG. 3D are schematic cross-sectional views along a cross-sectional line C-C' in FIG. 1 showing a manufacturing process of the semiconductor structure.

Referring to FIG. 1, FIG. 2A and FIG. 3A. In the present embodiment, in a step of using the first metal layer M1 to define the gate line 111, the masking metal pattern 112 may be defined simultaneously. As shown in FIG. 1, the number of the masking metal patterns 112 may be plural, such as four masking metal patterns, but the number of the masking metal patterns is not limited to as shown in FIG. 1.

Figure 3B:
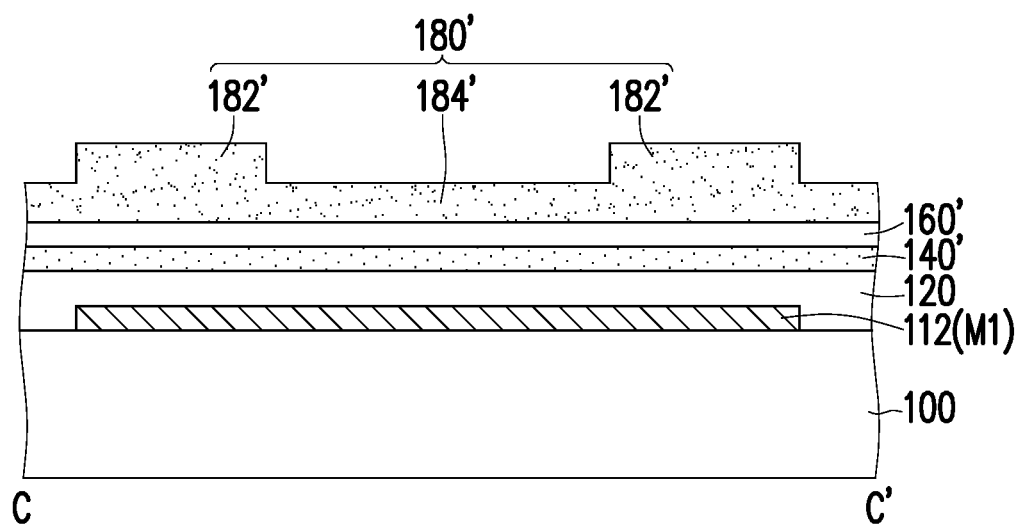

Referring to FIG. 1, FIG. 2C, and FIG. 3B. Further, the gate insulating layer 120, the oxide semiconductor layer 140' and the etch stopping material layer 160' are formed on the masking metal pattern 112 in sequence. Next, the photo resist material layer 180' is formed on the etch stopping material layer 160'. As shown in FIG. 3B, the photoresist material layer 180' includes the relatively thicker convex portion 182' and the relatively thinner concave portion 184'. A method of forming the convex portion 182' and the concave portion 184' of the photoresist material layer 180' of FIG. 3B is the same as the method shown in FIG. 2C; and therefore would not be described again herein.

Figure 3C:
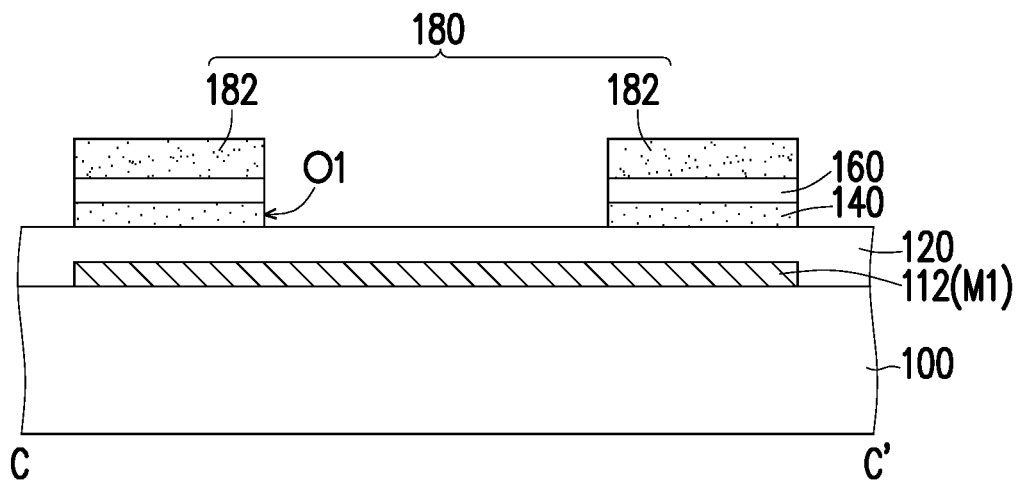

Referring to FIG. 1, FIG. 2D, FIG. 3B and FIG. 3C. Then, the photoresist material layer 180' is defined through the HTM (not shown) and a development procedure is performed, so as to remove the part of the concave portion 184' in the photoresist material layer 180', and to leave the part of the developed convex portion 182 to form the photoresist pattern 180. Referring to FIG. 2E and FIG. 3C. Next, the photoresist pattern 180 is used a mask to form the etch stopping pattern 160 and the oxide semiconductor layer 140. In the present embodiment, the etch stopping pattern 160 and an edge of the oxide semiconductor layer 140 may be aligned, but the invention is not limited thereto. In the step of forming the oxide semiconductor layer 140, the first opening O1 may be defined in the area that overlaps the masking pattern 112. As shown in FIG. 3C, in a direction perpendicular to the substrate 100, the first opening O1 overlaps with the gate insulating layer 120 and the masking pattern 112. From another perspective, the first opening O1 exposes the gate insulating layer 120.

Figure 3D:
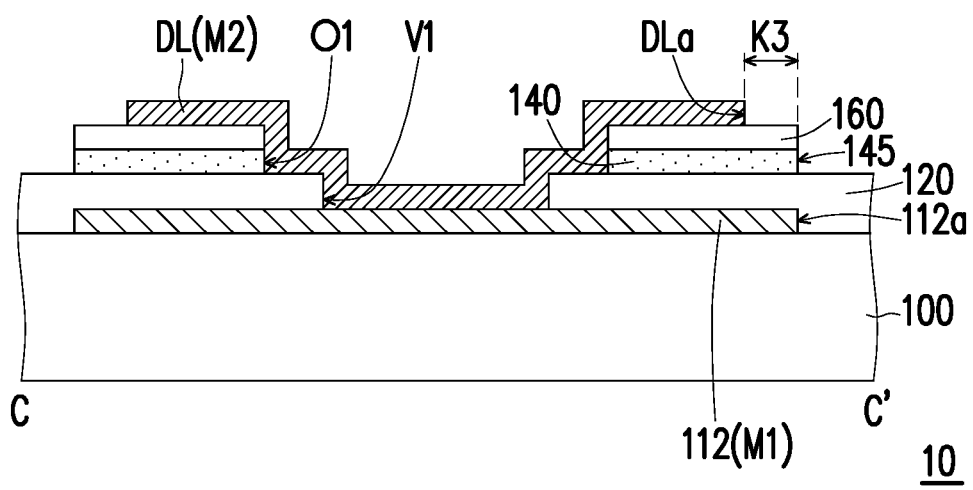

Please refer to FIG. 1, FIG. 2F, FIG. 3C and FIG. 3D. Next, the gate insulating layer 120 is patterned through using the photoresist pattern 180 and the etch stopping pattern 160 as the masks, and the first contacting window V1 is formed. As shown in FIG. 1 and FIG. 3D, the first contacting window V1 overlaps with the masking metal pattern 112. From another perspective, an orthographic projection of the first contacting window V1 on the substrate 100 is located within the orthographic projection of the first opening O1 on the substrate 100.

In brief, under the above configuration, the present embodiment may form the etch stopping pattern 160 and the oxide semiconductor layer 140 through a single photomask. Then, the gate insulating layer 120 is patterned through using the etch stopping pattern 160 as the mask to form the first contacting window V1. Therefore, the present embodiment may integrate the photomask used to pattern the oxide semiconductor material layer 140' and the photomask used to pattern the gate insulating layer 120 from the known manufacturing process, into a single photomask to reduce the number of the photomasks that are used, so as to further reduce manufacturing costs.

In addition, as shown in FIG. 2F and FIG. 3D, after removing the photoresist pattern 180, the second metal layer M2 is formed on the etch stopping pattern 160, and the data line DL is defined. In the present embodiment, the data line DL is disposed on the etch stopping pattern 160 and is conformally filled into the first opening O1 and the first contacting window V1. Therefore, the data line DL of the second metal layer M2 may be electrically connected to the masking metal layer 112 of the first metal layer M1 through the first contacting window V1. In addition, as shown in FIG. 1 and FIG. 3D, the etch stopping pattern 160 and the oxide semiconductor layer 140 are interposed between the data line DL and the masking metal pattern 112. Furthermore, the data line DL partially overlaps the masking metal pattern 112.

In the present embodiment, a distance K3 exists between an edge of the data line DL and the edge of the oxide semiconductor layer 140. Specifically, as shown in FIG. 1 and FIG. 3D, an orthographic projection of a side 145 of the oxide semiconductor layer 140 on the substrate 100 is aligned with a side 112a of the masking metal pattern 112. The side 145 is parallel to an orthographic projection of a side DLa of the data line DL on the substrate 100. The side DLa is an edge next to the side 145 of the oxide semiconductor layer 140. The distance K3 between the side 145 and the side DLa ranges from 0.5 μm to 1 μm. In other words, the orthographic projection of the oxide semiconductor pattern 140 on the substrate 100 extrudes from the orthographic projection of the data line DL on the substrate 100; but the invention is not limited thereto.

Under the above configuration, a probability of generating a parasitic capacitance between the data line DL and the masking metal layer 112 may be further reduced. In addition, the data line DL may increase the area used to transmit signals through being electrically connected to the masking metal layer 112, and to further reduce a risk of open circuit by disconnection. In addition, the function and reliability of the semiconductor structure 10 may be increased.

Figure 4:
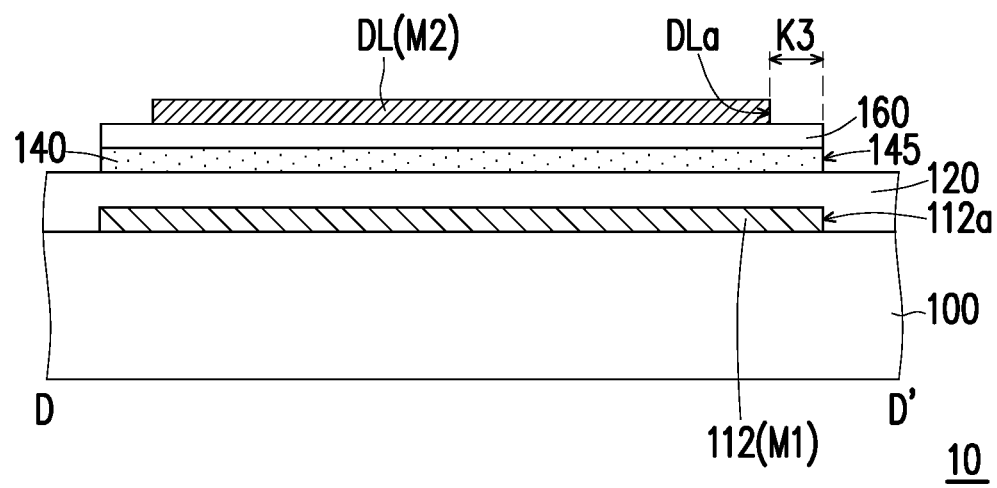
FIG. 4 is a schematic cross-sectional view along a cross-sectional line D-D' in FIG. 1.

FIG. 4 is a schematic cross-sectional view along a cross-sectional line D-D' in FIG. 1. Referring to FIG. 1, FIG. 3D and FIG. 4. The schematic cross-sectional view of the data line DL shown in FIG. 4 is similar to the schematic cross-sectional view of the data line DL shown in FIG. 3D. The difference lies in that the data line DL of FIG. 4 is not electrically connected to the masking metal pattern 112. Specifically, the gate insulating layer 120, the oxide semiconductor layer 140 and the etch stopping pattern 160 are interposed between the data line DL and the masking metal pattern 112. In addition, the distance K3 exists between an orthographic projection of the side DLa of the data line DL on the substrate 100 and an orthographic projection of the side 145 of the oxide semiconductor layer 140 on the substrate 100, and the distance K3 ranges from 0.5 µm to 1 µm. Under the above configuration, the gate insulating layer 120, the oxide semiconductor layer 140 and the etch stopping pattern 160 may further reduce the probability of generating a parasitic capacitance between the data line DL and the masking metal layer 112, so as to increase the performance of the semiconductor structure 10.

In summary of the above, the semiconductor structure and/or the manufacturing method thereof of an embodiment of the invention may directly dispose the etch stopping pattern with oxygen atoms on the oxide semiconductor layer and/or the oxide semiconductor pattern; therefore, the etch stopping pattern may be used to provide the oxygen atoms to the oxide semiconductor layer and/or the oxide semiconductor pattern to improve the issue of oxygen vacancy. In this way, the threshold voltage of the oxide semiconductor pattern may be a positive value, so as to improve the issue of current leakage, increasing the electrical property of the oxide semiconductor pattern, and having a property of a semiconductor. Thus, an open circuit test and a short circuit test may be directly performed on the semiconductor structure of the present embodiment instantly after completing the step of forming the source electrode, the drain electrode and the signal line. Therefore, an additional opening procedure is not needed, so that a test and repair procedure is adapted to be performed easily and a risk of disconnection may be reduced so that an excellent electrical property is obtained, and therefore manufacturing time and costs are further reduced.

Moreover, the semiconductor structure and the manufacturing method thereof of the invention may form the etch stopping pattern and the oxide semiconductor layer through a single photomask, and the gate insulating layer is patterned through using the etch stopping pattern as the mask. Therefore, the invention may integrate the photomask used to pattern the oxide semiconductor material layer and the photomask used to pattern the gate insulating layer from the known manufacturing process, into a single photomask to reduce the number of the photomasks used, so as to further reduce manufacturing costs.

In addition, the data line of the semiconductor structure may increase the area used to transmit signals and reduce a risk of open circuit by disconnection through being electrically connected to the masking metal layer, so as to increase the performance and reliability of the semiconductor structure. Furthermore, the gate insulating layer, the oxide semiconductor layer and the etch stopping pattern may be interposed between the data line and the masking metal pattern, so as to reduce a probability of generating a parasitic capacitance between the data line and the masking metal layer. Thus, the performance of the semiconductor structure is further increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor structure comprising:
   providing a substrate;
   forming a first metal layer on the substrate and patterning the first metal layer to define a gate line and a masking metal pattern, and the gate line is electrically connected to a gate;
   forming a gate insulating layer on the substrate and covering the gate line and the masking metal pattern;
   forming an oxide semiconductor material layer on the gate insulating layer;
   performing an annealing treatment to the oxide semiconductor material layer;
   forming an etch stopping material layer on the oxide semiconductor material layer;
   forming a photoresist material layer on the etch stopping material layer;
   defining the photoresist material layer with a half tone photomask to form a photoresist pattern;
   using the photoresist pattern as a mask, patterning the etch stopping material layer, to form an etch stopping pattern;
   using the photoresist pattern as the mask, patterning the oxide semiconductor material layer, to form an oxide semiconductor layer and to define a first opening overlapping the gate insulating layer;
   performing an ashing procedure to remove the photoresist pattern;
   using the etch stopping pattern as the mask, patterning the gate insulating layer, to form a first contacting window overlapping the masking metal pattern, wherein an orthographic projection of the first contacting window on the substrate is located within an orthographic projection of the first opening on the substrate;
   forming a second metal layer on the etch stopping pattern and patterning the second metal layer to define a source electrode, a drain electrode, a signal line and a data line, wherein parts of the etch stopping pattern are located between the second metal layer and the oxide semiconductor layer, and the data line is electrically connected to the masking metal pattern through the first contacting window; and
   patterning the oxide semiconductor layer to define an oxide semiconductor pattern, wherein the source electrode, the drain electrode and the signal line are electrically connected to the oxide semiconductor pattern.

2. The manufacturing method of the semiconductor structure according to claim 1, further comprising:
- forming a first passivation layer on the etch stopping pattern, and covering parts of the gate insulating layer, the etch stopping pattern, and the second metal layer, wherein the first passivation layer has a second contacting window;
- forming a color resist layer having a second opening overlapping the second contacting window on the first passivation layer, and an orthographic projection of the second contacting window on the substrate is located within an orthographic projection of the second opening on the substrate;
- forming a second passivation layer having a third opening overlapping the second contacting window on the color resist layer; and
- forming a pixel electrode electrically connected to the drain electrode through the second contacting window on the second passivation layer.

3. The manufacturing method of the semiconductor structure according to claim 1, wherein a material of the oxide semiconductor material layer comprises any one or a plurality of stacked layers selected from the group consisting of indium gallium zinc oxide, indium zinc oxide, indium gallium oxide, and indium tin zinc oxide.

4. The manufacturing method of the semiconductor structure according to claim 1, wherein a material of the etch stopping material layer comprises hafnium oxide, silica or aluminum oxide.

5. The manufacturing method of the semiconductor structure according to claim 1, wherein after the step of defining the oxide semiconductor pattern, an electrical property test procedure is further performed to test the source electrode, the drain electrode and the signal line.

6. The manufacturing method of the semiconductor structure according to claim 1, wherein the etch stopping pattern and the oxide semiconductor layer are interposed between the data line and the masking metal pattern.

7. The manufacturing method of the semiconductor structure according to claim 1, wherein an orthographic projection of a short side surface of the oxide semiconductor pattern on the substrate is parallel to an orthographic projection of a long side surface of the signal line overlapping the oxide semiconductor pattern on the substrate, and a distance between the short side surface and the long side surface ranges from 0.5 µm to 1 µm.

8. The manufacturing method of the semiconductor structure according to claim 1, wherein an orthographic projection of another short side surface of the oxide semiconductor pattern on the substrate is parallel to an orthographic projection of a long side surface of the drain electrode on the substrate, and a distance between the another short side surface and the long side surface ranges from 0.5 µm to 1 µm.

* * * * *